United States Patent

Beelitz

[15] 3,651,421

[45] Mar. 21, 1972

[54] GATED AMPLIFIER

[72] Inventor: Howard Raymond Beelitz, Princeton, N.J.

[73] Assignee: RCA Corporation

[22] Filed: June 8, 1970

[21] Appl. No.: 44,237

[52] U.S. Cl. ..........330/30 D, 330/69

[51] Int. Cl. ..........H03f 3/68

[58] Field of Search ..........330/30 D, 69

[56] References Cited

UNITED STATES PATENTS

| | | | |
|---|---|---|---|
| 3,435,359 | 3/1969 | Sennhenn | 330/22 |
| 3,445,780 | 5/1969 | Beelitz | 330/30 D X |

OTHER PUBLICATIONS

IBM Technical Disclosure Bulletin, Vol. 10, No. 8 Jan. 1968, pp. 1150, 1151 " Integrating Amplifier with AC Common Mode Noise Rejection" ; Benson et al.

*Primary Examiner*—Nathan Kaufman
*Attorney*—H. Christoffersen

[57] ABSTRACT

A gated amplifier which is useful, for example, as a sense amplifier in a semiconductor memory includes a first differential amplifier having two normally non-conducting transistors. The two transistors are rendered conductive for amplifying an input signal by a switchable constant-current source responsive to a gating signal. A first normally conducting emitter follower is coupled from the output of one transistor in the first differential amplifier to the input of a corresponding transistor in a second differential amplifier. A second normally conducting emitter follower is coupled from the output of the other transistor in the first differential amplifier through a threshold determining impedance to the input of the corresponding transistor in the second differential amplifier. The second differential amplifier switches in response to an input signal of one polarity exceeding a predetermined threshold, and is unresponsive to common mode signal disturbances coupled thereto from the first differential amplifier.

1 Claims, 2 Drawing Figures

INVENTOR.
Howard R. Beelitz
BY
Carl V. Olson
ATTORNEY

GATED AMPLIFIER

The invention described herein was made in the course of or under a contract or subcontract thereunder with the Department of the Air Force.

BACKGROUND OF THE INVENTION

Gated or strobed differential amplifiers are commonly used as sense amplifiers in random-access semiconductor and magnetic memory systems and in many other applications. Such amplifiers are required to be unresponsive to large noise and other undesired input signals when in a standby state, and to be fully responsive to a desired input signal when gated to an enable state. The digit drive noise in the memory due to the writing of information must be allowed to subside before the memory sense amplifier can correctly detect a "1" or "0" signal when reading from the memory. The gating or enabling of the sense amplifier may also cause disturbances in the amplifier which interfere with its correct response to the information signals. Existing sense amplifiers are less than fully satisfactory as regards simplicity, economy, sensitivity to desired signals, insensitivity to noise and gating disturbances, and adaptability to integrated circuit construction.

SUMMARY OF THE INVENTION

In accordance with an example of the invention, the sense amplifier is constructed to include a low-gain input differential amplifier which is normally disabled by a constant current source switch until such time as an input signal is present for detection. Signals are coupled from the two transistors of the input differential amplifier through emitter followers to the two transistors of a second differential amplifier. One of the emitter followers includes an additional emitter impedance operating to provide a signal amplitude threshold above which the signal is recognized as a "1" signal, and below which the signal is recognized as a "0". The second differential amplifier receives and amplifies differential signal amplitudes which are greater than the threshold value, and is unresponsive to differential noise amplitudes less than the threshold value. The second differential amplifier is also unresponsive to all common mode disturbances because of the differential signal coupling thereto.

DESCRIPTION OF THE PREFERRED EMBODIMENT

Figure 1:
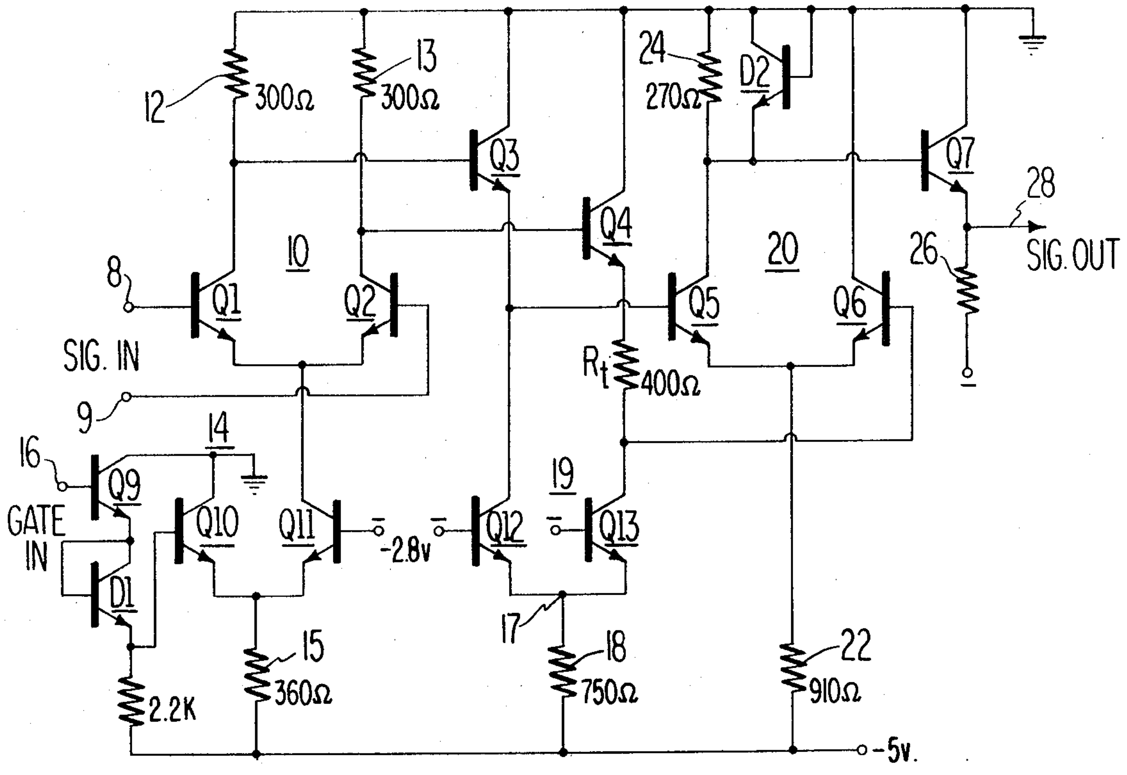
FIG. 1 of the drawing is a circuit diagram of a gated differential amplifier constructed according to the teachings of the invention.

Referring now in greater detail to the drawing, signal input terminals 8 and 9 are connected to the base electrodes of respective transistors Q1 and Q2 of a first or input differential amplifier 10. Transistors Q1 and Q2 are provided with individual collector resistors 12 and 13, and have their emitters connected together to the collector of a transistor Q11 included in a switchable constant-current source generally designated 14. The switchable constant-current source includes a transistor Q10 having an emitter resistor 15 in common with transistor Q11. Transistor Q10 and a transistor Q9 are arranged in a Darlington connection modified by a diode D1. Transistor Q10 is receptive to a gating signal at ECCSL logic levels through a transistor Q9 from a gating input signal terminal 16. Transistors Q9, Q10 and Q11 are biased so that transistor Q11 is normally cut off and normally maintains differential amplifier transistors Q1 and Q2 in a non-conducting state. Under these conditions, all the current of constant-current source 14 flows through transistor Q10 and common emitter resistor 15. When a more negative gate signal is applied to gating terminal 16, transistor Q10 is cut off, and all the current of the constant-current source flows through transistor Q11 thereby enabling the input differential amplifier including transistors Q1 and Q2.

The collector of transistor Q1 in input differential amplifier 10 is coupled through an emitter follower transistor Q11 thereby enabling the input differential amplifier including transistors Q1 and Q2.

The collector of transistor Q1 in input differential amplifier 10 is coupled through an emitter follower transistor Q3 to the base input terminal of a transistor Q5 included in a second differential amplifier 20. The collector of transistor Q2 in input differential amplifier 10 is coupled through a second emitter follower including transistor Q4, having an additional emitter threshold resistor $R_t$, to the base input terminal of transistor Q6 in the second differential amplifier 20. The emitter follower transistors Q3 and Q4 are provided with constant currents from a constant-current source 19 including transistors Q12 and Q13.

The common connection 17 from the emitters of transistors Q12 and Q13 to the emitter resistor 18 may be connected externally to a variable resistor or potentiometer (not shown) to vary the resistance at 18 for the purpose of adjusting the threshold at which the entire amplifier responds to input signals. Varying the resistance at 18 varies the equal currents through transistors Q12 and Q13, and varies the threshold voltage developed across threshold resistor $R_t$. The amplifier is adapted for construction in integrated circuit form, and the ability to connect a variable resistor across resistor 18 permits the integrated circuit sense amplifier to be adapted for use with various different memories requiring different signal threshold values.

The second or output differential amplifier 20 includes a common emitter resistor 22. Transistor Q5 has a collector resistor 24 shunted by a clamp D2 consisting of a transistor connected to operate as a diode. The output at the collector of transistor Q5 is connected to base of an output transistor Q7 which provides a single-ended output signal at output terminal 28.

OPERATION

The amplifier of FIG. 1 is normally disabled by reason of a disable signal level of −0.8 volts at the gate input terminal 16 which maintains transistors Q9 and Q10 conductive and transistor Q11 cut off. Signal input transistors Q1 and Q2 are normally nonconducting and zero volts is coupled therefrom to the bases of emitter follower transistors Q3 and Q4, which are biased to always conduct a constant current supplied from source 19. The equal currents in emitter follower transistors Q3 and Q4 result in equal emitter voltages of about −0.8 volts. The −0.8 volts is applied from the emitter of transistor Q3 to the base of transistor Q5. The −0.8 volts at the emitter of transistor Q4 is translated to a more negative voltage of about −1.2 volts by the threshold resistor $R_t$ and is applied to the base of transistor Q6. The voltage offset across resistor $R_t$ is always about −0.4 volts, in the example given, because of the constant current source 19. The more negative voltage applied to transistor Q6 maintains transistor Q6 cut off and, because of the differential amplifier connections, maintains transistor Q5 conducting. The voltage at the collector of conducting transistor Q5 is coupled in a single-end manner through output transistor Q7 to provide a "0" output signal of −1.6 volts at output terminal 28.

When the sense amplifier is disabled as described, the amplifier is insensitive to, and unaffected by, noise disturbances present at the signal input terminal 8 and 9. The input amplifier 10 is unresponsive to common mode input disturbances, such as from digit drive signals applied to the memory, because the amplifier is non-conducting. The input amplifier 10, being cut off, is also unresponsive to difference mode disturbances appearing on the signal input terminal 8 and 9.

The larger disturbances to which the sense amplifier is unresponsive occur during the application of digit signals to the memory for the purpose of writing information into the memory, and also during the application of digit signals to the memory to condition the memory for the reading out of the stored information. The sense amplifier is maintained disabled for a sufficient time after the application of digit signals to permit the disturbances to die down to a tollerable level. The described sense amplifier is characterized in being sufficiently insensitive to noise disturbances so that the sensing of stored information can take place after a shorter waiting period than is required for other comparable prior art sense amplifiers.

When the time for sensing the information stored in the memory occurs, the input differential amplifier 10 is enabled by the application of a −1.6 volts gate or enable signal to the gate input terminal 16 of the constant current switch 14. The constant current previously flowing through transistor Q10 is thus made to flow through transistor Q11, thereby causing input amplifier transistors Q1 and Q2 to be rendered conductive. The two transistors Q1 and Q2 will conduct equally if there is no "1" input signal present at the input terminals 8 and 9, and if there are also no noise disturbances present at the input terminal. In this case, the equal, more-negative signals at the collectors of transistors Q1 and Q2 are coupled, respectively, through the emitter follower transistor Q3 to the base of differential amplifier transistor Q5, and through the emitter follower transistor Q4 and threshold resistor $R_t$, with a −0.4 volt offset, to the base of differential transistor Q6. Since the signal change applied to transistors Q5 and Q6 is a common-mode signal change, it produces no effect at the output of differential amplifier 20. When input amplifier 10 is initially rendered conductive, the described equal currents flowing through the transistors Q1 and Q2 may not be equal, but may be slightly different due to differences in the characteristics of the two transistors and other components. The resulting difference mode signal coupled through the emitter followers to differential amplifier 20 produces no output from the amplifier 20 because it does not exceed the voltage offset or threshold provided by the threshold resistor $R_t$.

Figure 2:
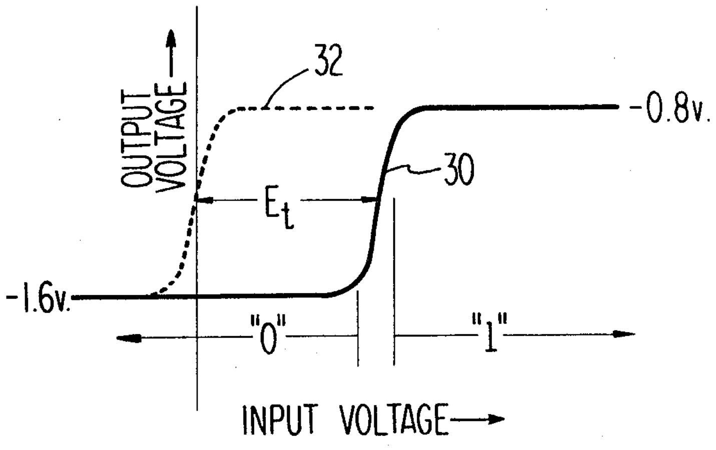
FIG. 2 is a voltage chart which will be referred to in describing the operation of the invention.

The overall transfer characteristic of the amplifier of FIG. 1 is illustrated by the curve 30 in the chart of FIG. 2. If there were no threshold resistor $R_t$, the input-output voltage characteristic would be as shown by the dotted line 32. The threshold resistor $R_t$ causes a shift of the characteristic to the right by the amount represented as $E_t$. Therefore, whenever the noise disturbance at the input terminals 8 and 9 produces differential voltage less than the voltage $E_t$, the amplifier is totally unresponsive to the disturbance and maintains a "0" output level at its output terminal 28.

If there is a "1" input signal present when the input differential amplifier 10 is enabled, the input signal causes a large imbalance in the currents flowing through the input transistors Q1 and Q2. The "1" input signal is assumed to be one in which the voltage on input terminal 8 is more positive (less negative) than the signal on input terminal 9. This causes a larger current to flow through transistor Q1 than through transistor Q2. The larger current flowing through transistor Q1 results in a negative-going voltage change at its collector which is coupled through emitter follower Q3 to the base of transistor Q5. A positive-going voltage change at the collector of transistor Q2 is coupled through emitter follower Q4 and appears at the emitter thereof. Substantially all of this positive-going voltage change is coupled through resistor $R_t$ to the base of transistor Q6, with about the −0.4 volt offset, since there is negligible voltage divider action at the connection between resistor $R_t$ and the very high impedance of current source transistor Q13.

The negative-going voltage change at the base of transistor Q5 and the positive-going voltage change at the base of transistor Q6 are in directions tending to cause a switching of conduction from transistor Q5 to transistor Q6. However, the switching cannot take place until the base of transistor Q5 is more negative than the base of transistor Q6. For this to occur, the voltage difference at the emitters of emitter follower transistors Q3 and Q4 must exceed the voltage offset provided by threshold resistor $R_t$. It is only when the differential signal applied to the bases of transistors Q5 and Q6 is sufficiently large in the correct direction to exceed the voltage offset that the differential amplifier 20 is caused to switch its conduction from transistor Q5 to transistor Q6. This occurs when the input differential signal at terminals 8 and 9 exceeds the threshold voltage $E_t$ in the chart of FIG. 2. When this occurs, the collector of transistor Q5 goes to about zero volts, which appears as a corresponding output signal of −0.8 volts at output terminal 28. The sense amplifier is maintained in an enabled state for a sufficient time to detect and utilize the input signal, and then the amplifier is again disabled until the next time that sensing is to take place.

It is important to note that the sense amplifier, when enabled, operates in a differential manner to amplify the sense signal in the output differential amplifier 20. That is, output amplifier 20 operates with the desirable common mode noise rejection characteristics in amplifying the input signal. The output amplifier 20 is different from the usual differential amplifier comparator threshold circuits in that one of its inputs is not coupled to a constant reference voltage for signal threshold purposes. The signal threshold is provided by the emitter followers, one of which includes the threshold resistor $R_t$. The arrangement is one in which common mode disturbances are coupled through the emitter followers to the output amplifier 20 with a substantially constant voltage offset provided by the resistor $R_t$. The output amplifier operates to fully amplify desired difference mode input signals while completely rejecting common mode disturbances from whatever cause, including power supply variations. The described sense amplifier is particularly well adapted for implementation in integrated circuit form because it is relatively simple, includes a minimum number of components, and requires a minimum amount of electrical power in its operation.

It will be understood that while the invention has been illustrated as embodied in a specific circuit having exemplary component values, and its operation has been described in terms of exemplary voltage conditions at various points in the circuit, that this has been done for reasons of clarity of description and not by way of limitation.

What is claimed is:

1. A gated amplifier, comprising a first differential amplifier including first and second transistors which are normally nonconductive, a switchable constant-current source responsive to a gating signal and connected to render conductive the two transistors in said first differential amplifier, a second differential amplifier including first and second transistors, a first emitter follower transistor having an input electrode connected to the output of the first transistor in the first differential amplifier, and having an output electrode connected directly to the input of the first transistor in the second differential amplifier, a threshold determining impedance, a second emitter follower transistor having an input electrode connected to the output of the second transistor in the first differential amplifier, and having an output electrode connected serially through said threshold determining impedance to the input of the second transistor in the second differential amplifier, means to apply a substantially constant current through the current conduction path of said first emitter follower transistor, and means to apply a substantially constant current serially through said threshold determining impedance and the current conduction path of said second emitter follower transistor, whereby said second differential amplifier switches in response to an input differential signal of one polarity applied to said first differential amplifier which exceeds a predetermined threshold determined by said impedance, and is unresponsive to all common mode signal disturbances coupled thereto.

* * * * *

UNITED STATES PATENT OFFICE
CERTIFICATE OF CORRECTION

Patent No. 3,651,421 Dated March 21, 1972

Inventor(s) Howard Raymond Beelitz

It is certified that error appears in the above-identified patent and that said Letters Patent are hereby corrected as shown below:

Column 2, lines 1-4, delete "The collector of transistor Q1 in input differential amplifier 10 is coupled through an emitter follower transistor Q11 thereby enabling the input differential amplifier including transistors Q1 and Q2."

Signed and sealed this 6th day of February 1973.

(SEAL)
Attest:

EDWARD M.FLETCHER,JR.
Attesting Officer

ROBERT GOTTSCHALK
Commissioner of Patents

FORM PO-1050 (10-69)
3530 6|72

USCOMM-DC 60376-P61
☆ U.S. GOVERNMENT PRINTING OFFICE 1969 O—366-33